United States Patent
Truskett et al.

(10) Patent No.: US 10,558,117 B2
(45) Date of Patent: Feb. 11, 2020

(54) IMPRINT APPARATUS AND ARTICLE MANUFACTURING METHOD

(71) Applicant: CANON KABUSHIKI KAISHA, Tokyo (JP)

(72) Inventors: Van Nguyen Truskett, Austin, TX (US); Matthew S. Shafran, Austin, TX (US); Saul Lee, Franklin, MI (US); Yoshikazu Miyajima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 387 days.

(21) Appl. No.: 14/717,044

(22) Filed: May 20, 2015

(65) Prior Publication Data

US 2016/0339626 A1 Nov. 24, 2016

(51) Int. Cl.
*G03F 7/00* (2006.01)
*B05C 11/10* (2006.01)

(52) U.S. Cl.
CPC ............ *G03F 7/0002* (2013.01); *B05C 11/10* (2013.01)

(58) Field of Classification Search
None
See application file for complete search history.

(56) References Cited

U.S. PATENT DOCUMENTS

| 4,445,124 A * | 4/1984 | Fujii | B41J 2/18 346/100 |
| 5,019,257 A * | 5/1991 | Suzuki | B01D 35/12 123/196 A |
| 5,231,424 A | 7/1993 | Kaneko et al. | |
| 5,956,062 A | 9/1999 | Omata et al. | |
| 6,116,727 A * | 9/2000 | Hagiwara | B41J 2/175 347/89 |
| 2002/0085076 A1* | 7/2002 | Romano, Jr. | B41J 2/18 347/89 |
| 2003/0168413 A1* | 9/2003 | Brett | B01D 37/046 210/791 |

(Continued)

FOREIGN PATENT DOCUMENTS

| CN | 202655193 U | 1/2013 |
| JP | 08244250 A | 9/1996 |

(Continued)

OTHER PUBLICATIONS

Search Report and Written Opinion issued in Singapore Appln. No. 10201603689U dated Dec. 19, 2016.

(Continued)

*Primary Examiner* — Charles Capozzi
(74) *Attorney, Agent, or Firm* — Rossi, Kimms & McDowell LLP (57) ABSTRACT

According to a first aspect of the present invention, an imprint apparatus for contacting a mold with a resin applied to a substrate to perform patterning on the substrate is provided that comprises a dispenser configured to apply the resin to the substrate; and a resin supply unit configured to supply the resin to the dispenser, wherein the resin supply unit comprises a resin storage tank configured to store the resin; a pump configured to continuously circulate the resin between the resin storage tank and the dispenser, and a filter arranged at a flow path of circulated resin, configured to remove a foreign matter or a metal ion.

9 Claims, 5 Drawing Sheets

(56) References Cited

U.S. PATENT DOCUMENTS

| | | | |
|---|---|---|---|
| 2003/0196959 A1* | 10/2003 | Hughes | B01J 39/04 |
| | | | 210/669 |
| 2005/0006294 A1* | 1/2005 | Stinson | B01D 36/02 |
| | | | 210/259 |
| 2008/0087615 A1 | 4/2008 | Taniguchi et al. | |
| 2008/0273063 A1 | 11/2008 | Wouters et al. | |
| 2010/0096774 A1 | 4/2010 | Kruijt-Stegeman et al. | |
| 2010/0102471 A1 | 4/2010 | Truskett et al. | |
| 2013/0076810 A1 | 3/2013 | Shibata | |

FOREIGN PATENT DOCUMENTS

| | | |
|---|---|---|
| JP | 2010098310 A | 4/2010 |
| JP | 2014082469 A | 5/2014 |
| JP | 2014192377 A | 10/2014 |
| JP | 2015018966 A | 1/2015 |

OTHER PUBLICATIONS

Office Action issued in Taiwanese Appln. No. 105115054 dated Nov. 13, 2017. English Translation provided.
Office Action issued in Chinese Appln. No. 201610325478.0 dated May 31, 2019. English translation provided.
Office Action issued in Japanese Patent Application No. 2016-061223 dated Nov. 26, 2019. English translation provided.

* cited by examiner

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

As the demand for microfabrication of semiconductor devices or MEMS increases, not only a conventional photolithography technique but also a microfabrication technique in which an uncured resin supplied to a substrate (wafer) is molded by a mold to thereby form a resin pattern on the substrate have been receiving attention. This technique is also referred to as an "imprint technique", by which a fine structure with dimensions of a few nanometers can be formed on a substrate. One example of imprint techniques includes a photo-curing method. An imprint apparatus employing the photo-curing method first supplies an uncured resin (photocurable resin) to a patterning region on a substrate. Next, the resin on the substrate is brought into contact with (is molded against) the mold with a pattern thereon. The resin is cured by irradiation of light while the resin is in contact with the mold. By expanding a space between the substrate and the mold (by releasing the mold from the cured resin), a resin pattern is formed on the substrate.

Upon manufacturing, for example, semiconductor devices, using such an imprint apparatus, a resin is typically applied to (dripped on) a shot in the inkjet system each time a pattern is formed on each shot, i.e., each time a mold is pressed against the resin. Here, if a resin includes particles upon applying the resin to a substrate, normal pattern formation is inhibited by the remaining presence of particles in the pattern section, resulting in occurrence of a pattern defect. Japanese Patent Laid-Open No. H8-244250 discloses an inkjet recording apparatus in which a filter for restricting foreign matters or the like having a diameter of greater than 10 μm from passing therethrough is arranged in the flow paths on the (forward route) side through which the ink flows in an inkjet head and the (return route) side through which the ink flows out from the inkjet head. Also, Japanese Patent Laid-Open No. H8-244250 discloses that a pump which is arranged between the filter on the return route side and the ink tank is activated upon recovery operation to remove air bubbles accumulated in the filter by securing a flow rate equivalent to that on the forward route side. Japanese Patent Laid-Open No. 2010-098310 discloses an inkjet recording apparatus in which a filter member having a diameter of 5 μm or greater is provided at the rear side of an element substrate for an inkjet head and pumps are provided between the ink tank and the inkjet head on each of the forward route side and the return route side. Also, Japanese Patent Laid-Open No. 2010-098310 discloses that a looser filter than the filter member is provided at the inlet of the inkjet head.

SUMMARY OF THE INVENTION

According to a first aspect of the present invention, an imprint apparatus for contacting a mold with a resin applied to a substrate to perform patterning on the substrate is provided that comprises a dispenser configured to apply the resin to the substrate; and a resin supply unit configured to supply the resin to the dispenser, wherein the resin supply unit comprises a resin storage tank configured to store the resin; a pump configured to continuously circulate the resin between the resin storage tank and the dispenser, and a filter arranged at a flow path of circulated resin, configured to remove a foreign matter or a metal ion.

DESCRIPTION OF THE EMBODIMENTS

Hereinafter, preferred embodiments of the present invention will be described (with reference to the drawings).
(First Embodiment)

Figure 1:
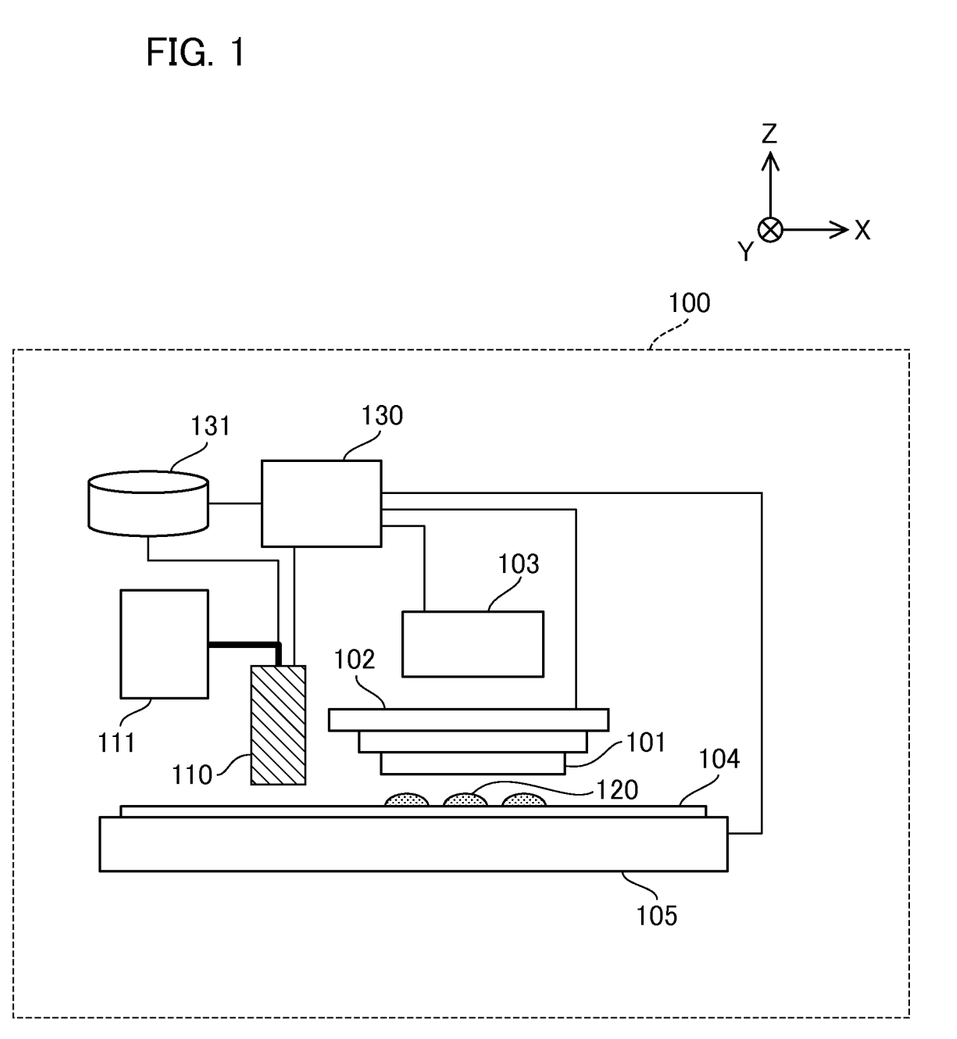
FIG. 1 is a schematic diagram illustrating a configuration of an imprint apparatus according to a first embodiment of the present invention.

First, a description will be given of an imprint apparatus including a resin supply unit according to a first embodiment of the present invention. FIG. 1 is a schematic diagram illustrating a configuration of an imprint apparatus 100 according to the present invention. The imprint apparatus 100 is used in the manufacture of articles such as semiconductor devices and the like. The imprint apparatus 100 is an apparatus that contacts a concave-convex pattern formed on the surface of an original (mold) 101 with an uncured resin (resist) 120 applied to a substrate (wafer) 104 to thereby transfer an inverse image of the pattern to the substrate 104. In the present embodiment, the imprint apparatus 100 employs a photo-curing method for curing a resin by irradiation of ultraviolet light as a resin curing method. The imprint apparatus 100 includes an original head 102 for holding the original 101, an ultraviolet radiating unit 103, a stage 105 for holding the substrate 104, a dispenser 110 for applying a resin onto the substrate 104, a resin supply unit 111, a controller 130, and an applying pattern storage unit 131. The original 101 has a pattern section (recess section) 101A, on which a pattern to be transferred to a resin supplied to the substrate 104 is formed, on a surface opposite the substrate 104. The original 101 has, for example, a rectangular outer shape and is configured by a material (for example, quartz) through which ultraviolet light can be transmitted. The original head 102 holds (fixes) the original 101 by a vacuum suction force or an electrostatic force. The original head 102 includes a drive mechanism that drives the original 101 in the Z-axis direction. The drive mechanism presses the original 101 against the resin (uncured resin) 120 applied to the substrate 104 with adequate force (a mold-pressing operation), and then releases the original 101 from the resin (cured resin) 120 on the substrate 104 (a mold-releasing operation). The substrate 104 is a substrate onto which the pattern of the original 101 is to be transferred, and includes, for example, a single crystal silicon wafer, a SOI (silicon on insulator) wafer, or the like. The stage 105 includes a substrate chuck for holding the substrate 104 and a drive mechanism that performs alignment between the original 101 and the substrate 104. The drive mechanism is configured by, for example, a coarse-driving system and a fine-driving system, and drives the substrate 104 in the X-axis direction and the Y-axis direction. The drive mechanism may also include a function of driving the substrate 104 not only in the X-axis direction and the Y-axis direction but also in the Z-axis direction and the 0 (rotation about the Z-axis) direction and a tilt function of correcting the tilt of the substrate 104. The resin supply unit 111 includes a tank for storing uncured resin therein, where the uncured resin is supplied to the dispenser 110 through pipes (flow paths). The dispenser 110 is a mechanism for applying the resin 120 and has, for example, a plurality of nozzles for applying the resin 120 to the substrate 104. The unit of the applied amount of the resin 120 from the dispenser 110 is a "drop" and the amount of one drop of the resin 120 is about a few picoliters. The resin can be dripped at each predetermined width of about a few mm. The resin 120 is applied by the dispenser 110 while supplying the resin 120 from the resin supply unit 111 by the movement (scan movement or step movement) of the stage 105, so that a resin layer is formed on the substrate 104 (the shot region thereof). The controller 130 includes a CPU, a memory, or the like and controls the overall (operation) of the imprint apparatus 100. The controller 130 functions as a processing unit configured to perform imprint processing by controlling the respective units of the imprint apparatus 100.

Next, a description will be given of an imprint step. First, a desired original 101 is prepared and mounted on the imprint apparatus 100. The original 101 is a concave-convex pattern (grooves) formed on a transparent quartz substrate for use in, for example, a typical photo mask in accordance with design data. Next, the dispenser 110 is prepared and mounted on the imprint apparatus 100. Then, the substrate 104 is mounted on the stage 105 and is fixed thereto. Next, a region which has not yet been imprinted is designated as an imprint position. A region to be imprinted at one time is called as a "shot". The sequence of imprint can be made in the order of continuous shots to the substrate 104. The sequence of imprint is not limited to the above sequence but may be set to a staggered sequence, a randomized sequence, or the like. Next, the photocurable resin 120 is applied to the substrate 104 using the dispenser 110 of the inkjet system. At this time, the stage 105 moves in accordance with the resin applied pattern, and the dispenser 110 sequentially drips the resin 120 on the substrate 104. After the resin 120 has been applied to the substrate 104, the original 101 is brought into close proximity with the substrate 104, and then the original 101 is pressed against the resin 120 for a predetermined time, so that the drop-like resin 120 is filled in the concave-convex of the original 101. The original 101 is held in this state until the resin has penetrated into the fine pattern of the original 101. After the resin has sufficiently been filled in the concave-convex of the original 101, the resin 120 is cured by radiating ultraviolet light for a predetermined time from the backside of the original 101 using the ultraviolet light lamp of the ultraviolet radiating unit 103. For example, a halogen lamp, an LED, or the like may be used as an ultraviolet light lamp. Next, the original 101 is peeled off and released from the cured resin 120. In this manner, a protruding resin pattern region 121 is formed on the resin 120. After the resin pattern has been completely formed over the entire region on the substrate, the resulting substrate is discharged.

Figure 4:
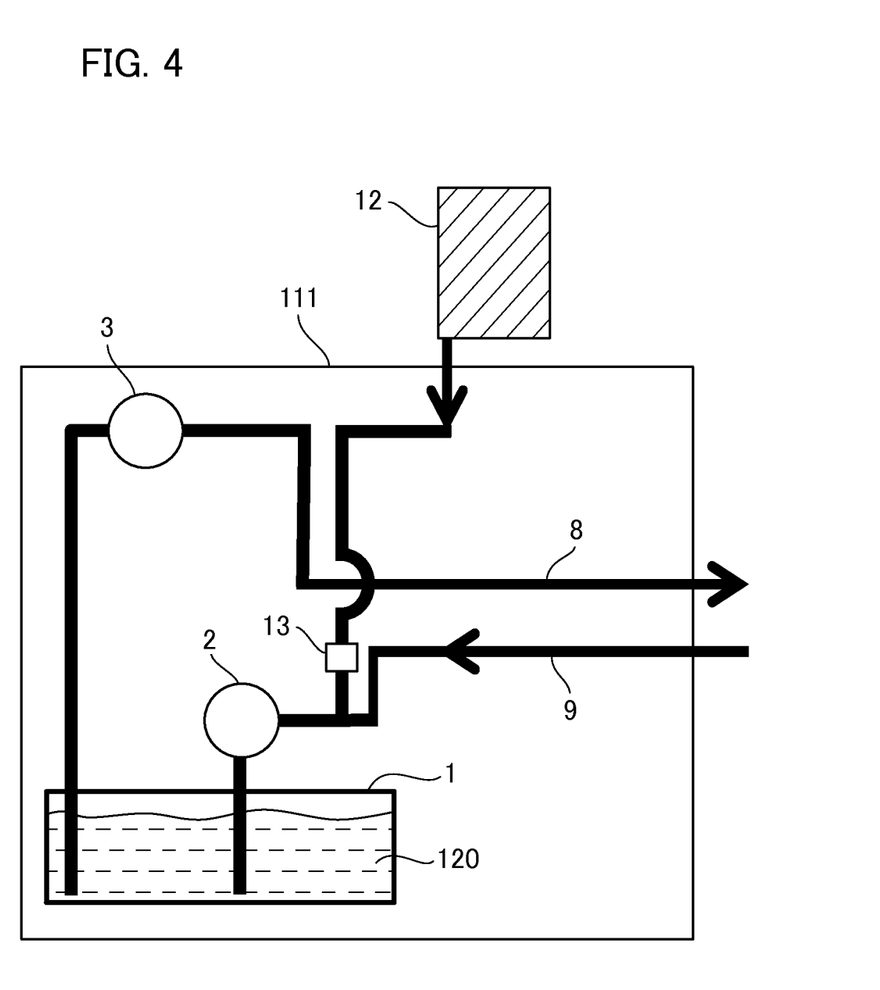
FIG. 4 is a schematic diagram illustrating a configuration of a resin supply unit provided in the conventional imprint apparatus.

Next, a description will be given of a resin supply unit configured to supply a resin to a dispenser. First, a description will be given of a configuration of a resin supply unit of the conventional imprint apparatus for comparison. FIG. 4 is a schematic diagram illustrating a configuration of a conventional resin supply unit. The resin 120 is supplied from the resin supply tank 12 to refill the resin 120 to a resin storage main tank (resin storage tank) 1. At this time, the resin 120 is refilled to the resin storage main tank 1 by opening a three-way valve 13 to allow for the passage of the resin 120 from the resin supply tank 12 to the storage main tank 1. The three-way valve 13 is operable to either provide the flow from the resin supply tank 12 to the resin main storage tank 1 while shutting off the flow from the dispenser 110 to the resin storage main tank 1 or to provide the flow from the dispenser 110 to the resin storage main tank 1 while shutting off the flow from the resin supply tank 12. Once the resin storage main tank 1 is adequately filled with the resin 120, the three-way valve 13 is then adjusted to shut off the flow from the resin supply tank 12 and to open the flow from the dispenser 110 to the resin storage main tank 1. By the operation of a negative pressure pump (pressure generating unit) 2 and a positive pressure pump (pressure generating unit) 3, the resin 120 is supplied from a resin supply line 8 to the dispenser 110. Furthermore, the remaining resin 120 discharged from the dispenser 110 is returned (in circulation) back to the resin storage main tank 1 via a resin recovery line 9. In such a configuration, a change in temperature of the resin 120, incorporation of particle foreign matters and metal ions into the resin 120, and the like may cause adverse effects to pattern accuracy during imprinting.

Figure 5A:
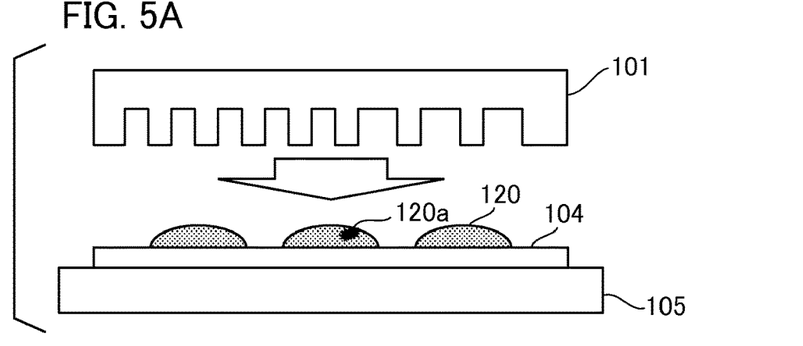
FIGS. 5A to 5D are diagrams illustrating a pattern defect which may occur during conventional imprinting.
Figure 5B:
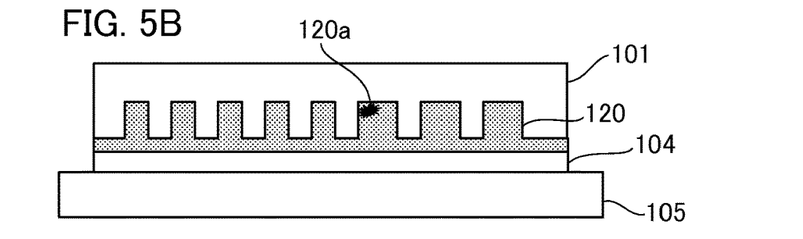
Figure 5C:
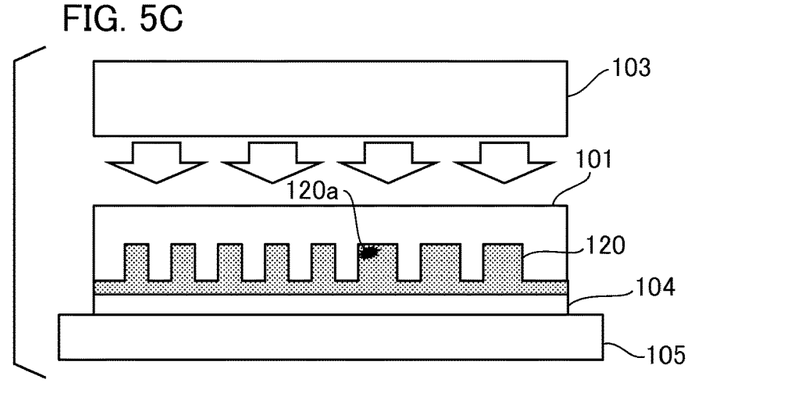
Figure 5D:
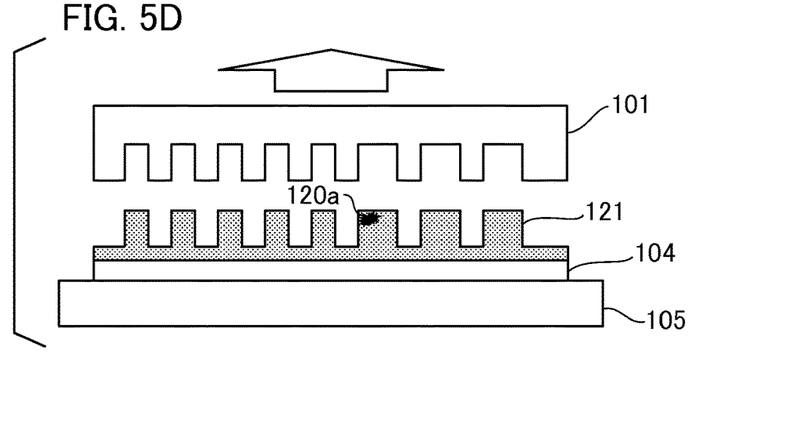

Here, a description will be given of adverse effects to pattern accuracy during imprinting by the conventional configuration as described above. As shown in FIG. 5A to FIG. 5D, if a foreign matter 120A such as fine particles or metal ions is incorporated into the resin 120, such a foreign matter 120A is imprinted on the pattern section together with the resin 120 upon transfer of the original 101. At this time, the foreign matter 120A is fixed upon curing the resin 120 as shown in FIG. 5C, and the foreign matter 120A finally remains as a foreign matter on the resin pattern 121 as shown in FIG. 5D, resulting in occurrence of a pattern defect.

Figure 2:
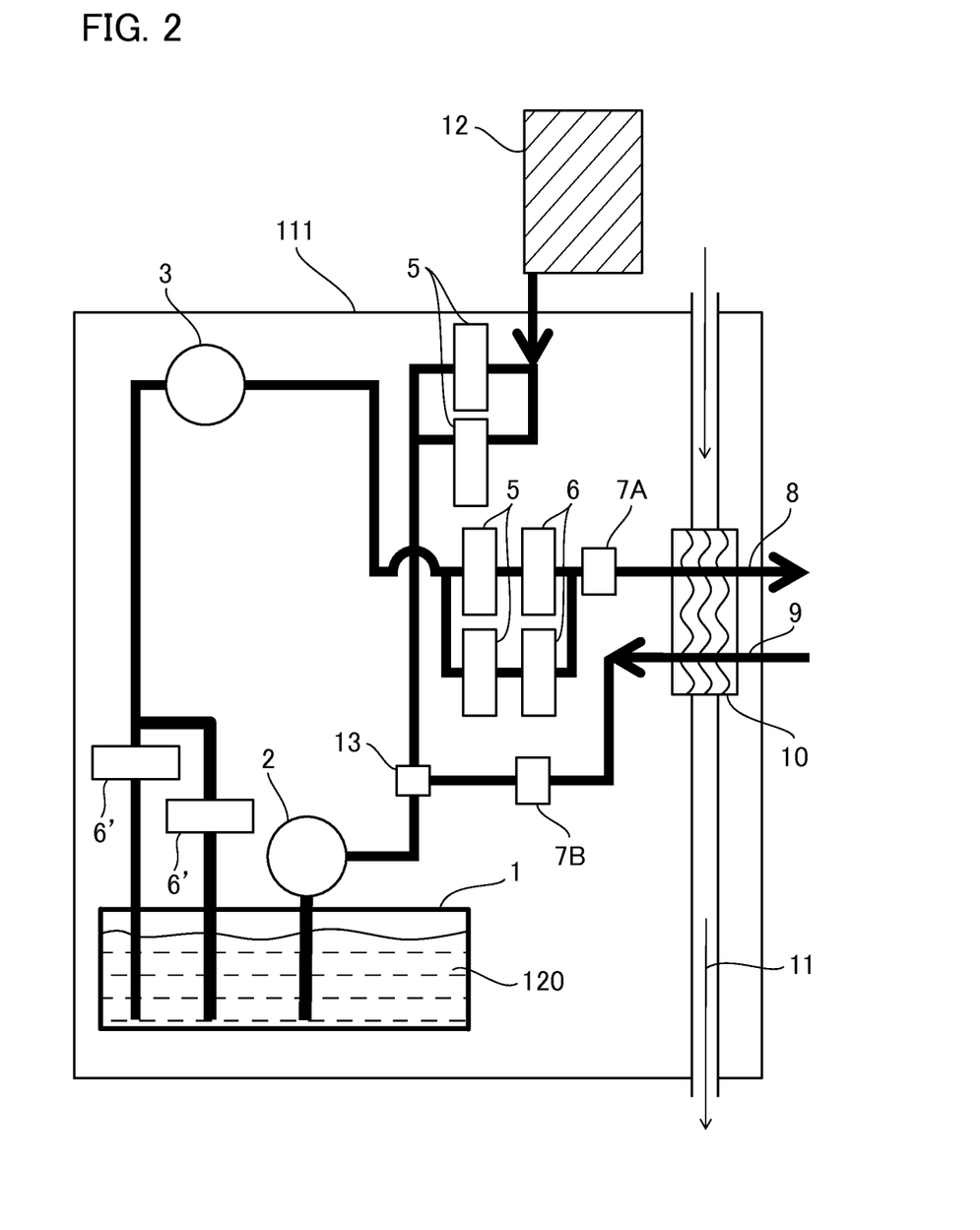
FIG. 2 is a schematic diagram illustrating a configuration of a resin supply unit according to the first embodiment of the present invention.

In contrast, the occurrence of such circumstances as described above is minimized by using the resin supply unit 111 according to the present embodiment. Hereinafter, a description will be given in detail of a specific configuration and operation of the resin supply unit 111 according to the present embodiment. FIG. 2 is a schematic diagram illustrating a configuration of the resin supply unit 111 according to the present embodiment. The resin 120 is supplied from the resin supply tank 12 to refill the resin 120 to the resin storage main tank 1. At this time, a metal ion removal filter (a filter using an ion-exchange resin and nylon fibers) 5 is provided between the resin supply tank 12 and the opening and closing valve 13. In this manner, when the resin 120 is refilled to the resin storage main tank 1 by opening the opening and closing valve 13, the resin 120 can be refilled to the resin storage main tank 1 with metal ions removed therefrom. The metal ion removal filter 5 is arranged in parallel in plural numbers as shown in FIG. 2 and can reduce an increase in the pressure load on the pump. Furthermore, the metal ion removal filter 5 and the particle removal filter (foreign matter removal filter) 6 are arranged in parallel in plural numbers at the discharging side of the pump 3. The particle removal filter 6 is a filter for removing foreign matters having a diameter φ of 10 nm or greater and uses a filter having the minimum mesh size which enables the circulation by the pump. Since the particle removal filter 6 is a filter having a fine mesh size, it causes a large pressure loss. The particle removal filter 6 is arranged in parallel in plural numbers as shown in FIG. 2, resulting in a reduction in the increase in the pressure load on the pump. Furthermore, the particle removal filter 6' for removing foreign matters such as particles from the resin storage main tank 1 is also arranged between the resin storage main tank 1 and the pump 3 (a supply line). The particle removal filter 6' is a filter for removing foreign matters having a diameter of 10 nm or greater and uses a filter having the minimum mesh size which enables the circulation by the pump. Since the particle removal filter 6' is a filter having a fine mesh size, it causes a large pressure loss. As shown in FIG. 2, the particle removal filter 6' is arranged in parallel in plural numbers at both of a discharging side and a suction side, resulting in comprehensive reduction in the increase of the pressure load on the pump 3 of entire resin supply unit 111. According to the configuration of the embodiment, the particles of the resin within the resin storage main tank 1 are removed (reduced) by using the particle removal filter 6' at the suction side, and the resin from which the particles are removed (reduced) can be supplied to the pump 3. In particular, such configuration of the embodiment is preferred in a case where there is a possibility that particles adhere within the resin storage main tank 1 for an example. Furthermore, the particles generated in the pump 3 are removed (reduced) by using the particle removal filter 6 at the discharging side, and the resin from which the particles are removed (reduced) can be supplied to the dispenser 110. By the operation of the pump 2 and the pump 3 in such a configuration, the resin 120 is supplied from the resin supply line 8 to the dispenser 110. Furthermore, the remaining resin 120 discharged from the dispenser 110 is returned back to the resin storage main tank 1 via the resin recovery line 9 (the resin flows and circulates).

A pressure sensor 7A for monitoring a supply pressure is provided on the supply outlet of the resin supply line 8 and a pressure sensor 7B for monitoring a recovery pressure is provided on the recovery inlet of the resin recovery line 9. In this manner, the resin 120 is controlled to be supplied in a positive pressure state at the supply side outlet and is controlled to be recovered in a negative pressure state at the recovery side inlet such that the pressure of the dispenser 110 becomes zero.

Furthermore, a heat exchanger 10 for adjusting the temperature of the pipes and the resin 120 flowing therethrough is provided near the outlet of the resin supply line 8 and the inlet of the resin recovery line 9, and a temperature adjusting medium 11 flows through the heat exchanger 10. The resin supply line 8 is arranged on the upstream side of the temperature adjusting medium 11 to be supplied to the heat exchanger 10 and the resin recovery line 9 is arranged on the downstream side of the temperature adjusting medium 11 to be supplied to the heat exchanger 10. In this manner, the temperature adjusting medium 11 can perform highly-accurate temperature adjustment of the resin 120 upon supply thereof. For example, although the temperature of the resin 120 may rise due to adverse effects of the imprint head, the temperature of the resin 120 can also be adjusted upon recovery thereof according to the present embodiment. As described above, the temperature of the resin 120 to be supplied and recovered is adjusted at least two times in the flow paths through which the resin storage main tank 1 is connected to the dispenser 110 so as to circulate the resin 120, so that the temperature of the resin 120 can be adjusted more efficiently. As the temperature adjusting medium 11, a temperature adjusting gas or a temperature adjusting liquid refrigerant for maintaining the temperature within the imprint apparatus 100 to be constant is used, and the temperature of the resin 120 is adjusted by flowing the temperature adjusting gas or the temperature adjusting liquid refrigerant through the dispenser 110.

As described above, according to the present embodiment, an imprint apparatus that is capable of removing metal ions and particles having a diameter of 10 nm or greater while reducing an increase in the pressure load on the pump as well as suppressing the occurrence of a pattern defect and improving pattern transfer accuracy may be provided.

(Second Embodiment)

Figure 3:
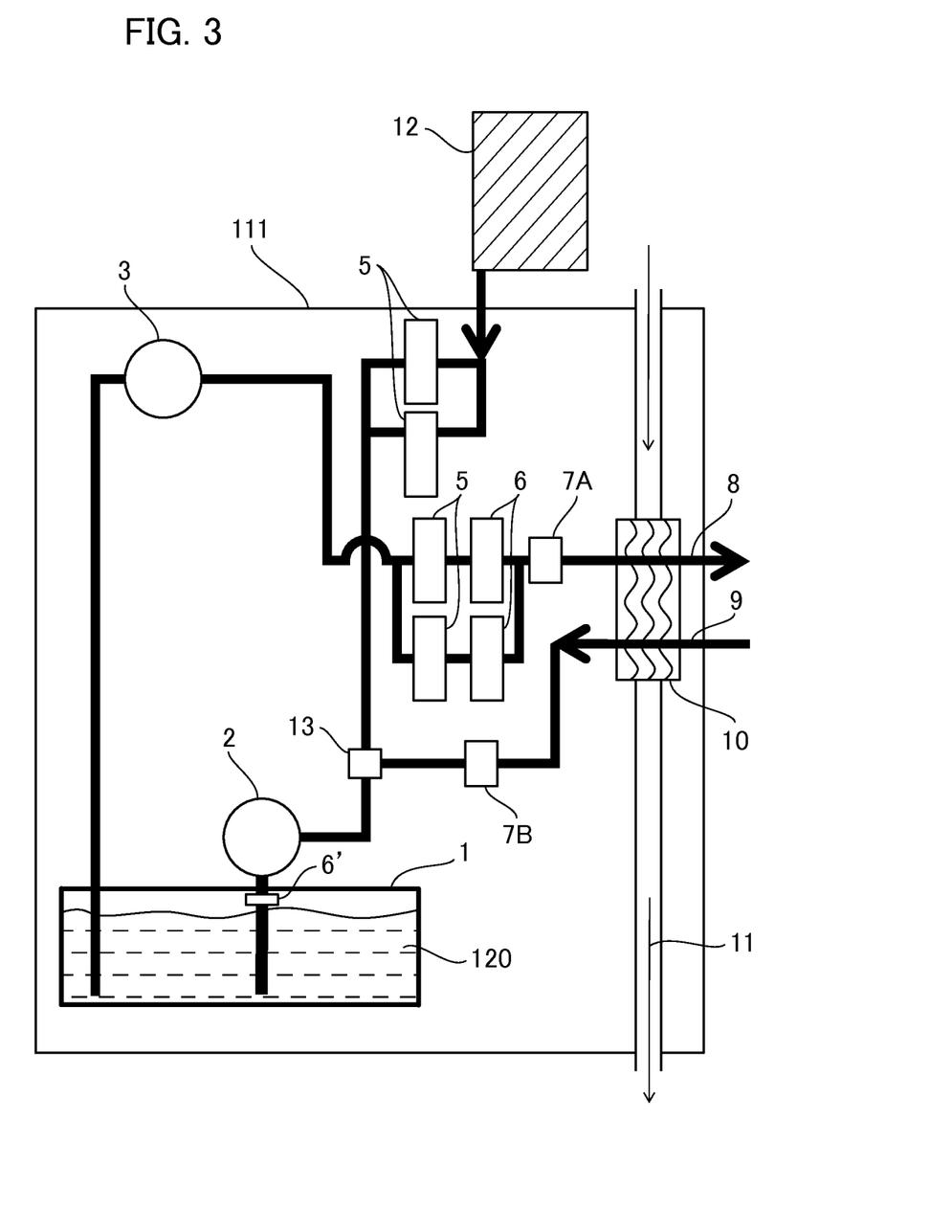
FIG. 3 is a schematic diagram illustrating a configuration of a resin supply unit according to a second embodiment of the present invention.

Next, a description will be given of a resin supply unit according to a second embodiment of the present invention. FIG. 3 is a schematic diagram illustrating a configuration of a resin supply unit according to a second embodiment of the present invention. The resin supply unit 111 of the second embodiment does not have the particle removal filter between the resin storage main tank 1 and the pump 3 (a supply line) but instead of that, the particle removal filter 6' is arranged between the pump 2 and the resin storage main tank 1 (a recovery line). In this point, the resin supply unit 111 of the second embodiment is different from that of the first embodiment. According to the second embodiment, the pressure load on pump 3 can be made smaller when compared to the first embodiment. The filter 6' can also be positioned in the alternative between the valve 13 and the pump 2. Whether to adopt the first embodiment or the second embodiment may as well be determined according to degrees of adherence of particles within the resin storage main tank 1.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of the present embodiment has an advantage, as compared with a conventional method, in at least one of performance, quality, productivity and production cost of an article.

While, in the above embodiments, the heat exchanger 10 is arranged such that the temperature of the resin 120 is adjusted upon supply and recovery of the resin 120, the present invention is not limited thereto. For example, the heat exchangers 10 may also be arranged on the upstream side and the downstream side of the direction along which the resin 120 in the resin supply line 8 flows so as to perform coarse temperature adjustment on the upstream side and fine temperature adjustment on the downstream side. The heat exchangers 10 may also be arranged to perform temperature adjustment in plural times upon supply of the resin 120 so that the temperature of the resin 120 can be adjusted efficiently.

While, in the above embodiments, the metal ion removal filter 5 is provided on the refill path for connecting the resin supply tank 12 and the opening and closing valve 13, the present invention is not limited thereto but the particle removal filter 6 may also be provided. Likewise, the metal ion removal filter 5 and the particle removal filter 6 provided in the above embodiments may also be interchangeably arranged in the flow paths through which the resin storage main tank 1 is connected to the dispenser 110 so as to circulate the resin 120.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An apparatus comprising:
   a dispenser configured to apply an uncured material to a substrate;
   a material supply unit configured to supply the uncured material to the dispenser; and
   a controller configured to control the material supply unit, wherein the material supply unit comprises:
   a material storage tank configured to store the uncured material;
   a pump configured to circulate the uncured material between the material storage tank and the dispenser, and
   filters arranged at flow paths of circulated uncured material,
   wherein the filters are arranged corresponding to the flow paths and each of the flow paths includes a first filter that removes ions and a second filter that removes particles in the corresponding flow path, and
   wherein the controller is configured to control a pressure of an outlet of the material supply unit that is an outlet of a flow path from the material storage tank to the dispenser to be in a positive pressure state, and is configured to control a pressure of an inlet of the material supply unit that is an inlet of a flow path from the dispenser to the material storage tank to be in a negative pressure state, such that the uncured material is circulated so that a pressure of the dispenser becomes zero.

2. The apparatus according to claim 1, wherein the second filters are configured to remove particles having a diameter of 10 nm or greater.

3. The apparatus according to claim 1, wherein the pump is arranged at a supply line for supplying the uncured material from the material storage tank to the dispenser, and wherein the first filter and the second filter in each of the flow paths are arranged at the supply line.

4. The apparatus according to claim 1, wherein the pump is arranged at a supply line for supplying the uncured material from the material storage tank to the dispenser, and wherein the filters include the first filter and the second filter, and wherein the first filter is arranged between the pump and the dispenser and the second filter is arranged between the pump and the material storage tank.

5. The apparatus according to claim 1, further comprising another second filter that removes particles arranged at a recovery line for recovering the uncured material from the dispenser to the material storage tank.

6. The apparatus according to claim 1, further comprising:
   another first filter that removes ions and another second filter that removes particles arranged at a refill path for refilling an uncured material to the material storage tank.

7. The apparatus according to claim 1, wherein the flow paths are arranged in parallel.

8. The apparatus according to claim 1, wherein in a first flow path of circulated uncured material among the flow paths of the circulated uncured material, the first filter that removes ions and the second filter that removes particles in the first flow path are arranged such that the first filter is directly connected to the second filter in the first flow path, and
wherein in a second flow path of circulated uncured material among the flow paths of the circulated uncured material, the first filter that removes ions and the second filter that removes particles in the second flow path are arranged such that the first filter is directly connected to the second filter in the second flow path.

9. The apparatus according to claim 1, wherein the first filter that removes ions and the second filter that removes particles are arranged in each of the flow paths such that the uncured material that passed through the first filter that removes ions passes through the second filter that removes particles, and such that the first filter that removes ions and the second filter that removes particles are both arranged between the pump and the dispenser in each of the flow paths.

* * * * *